United States Patent [19]
Farkas et al.

[11] Patent Number: 5,863,838
[45] Date of Patent: Jan. 26, 1999

[54] METHOD FOR CHEMICALLY-MECHANICALLY POLISHING A METAL LAYER

[75] Inventors: Janos Farkas, Austin; Melissa Freeman, Round Rock, both of Tex.

[73] Assignee: Motorola, Inc., Schaumburg, Ill.

[21] Appl. No.: 684,782

[22] Filed: Jul. 22, 1996

[51] Int. Cl.$^6$ .................................. C23F 3/18; H05K 3/26
[52] U.S. Cl. .......................... 438/693; 438/692; 438/691; 216/100; 216/102; 216/105; 216/89; 216/95
[58] Field of Search .................................. 216/88, 89, 95, 216/96, 99, 100, 102, 105; 438/690, 691, 692, 693

[56] References Cited

U.S. PATENT DOCUMENTS

| | | | |
|---|---|---|---|
| 5,084,071 | 1/1992 | Nenadic et al. | 51/309 |
| 5,139,571 | 8/1992 | Deal et al. | 106/3 |
| 5,225,034 | 7/1993 | Yu et al. | 156/636 |
| 5,391,258 | 2/1995 | Brancaleoni et al. | 156/636 |
| 5,527,423 | 6/1996 | Neville et al. | 156/636.1 |

OTHER PUBLICATIONS

S.P.Muraka, et al., "Advanced Metallization for Devices and Circuits—Science, Technology and Manufacturability", Mat.,Res.Soc.Symp.Proc., vol. 337, Apr. 4–8, 1994, pp. 133–138.

Ronald Carpio, et al., "Initial study on copper CMP slurry chemistries", Sematech, Thin Solid Films 266 (1995), pp. 238–244.

F.B.Kaufman, et al., "Chemical–Mechanical Polishing for Fabricating Patterned W Metal Features as Chip Interconnects", J.Electrochem, Soc., vol. 138, No. 11, Nov. 1991, pp. 3460–3465.

*Primary Examiner*—Marion McCamish
*Assistant Examiner*—Cheryl Juska
*Attorney, Agent, or Firm*—George R. Meyer

[57] ABSTRACT

A method of manufacturing a semiconductor device includes providing (51) a substrate (19), providing (52) a colloid (17) having particles held in suspension, providing (53) a reagent (18), disposing (54) the substrate (19) in a processing tool (10), combining (55) the colloid (17) and the reagent (18) to form a slurry (28), decomposing (56) the reagent (18) into a surfactant and an oxidizer, using (57) the slurry (28) to process the substrate (19) in the processing tool (10), and removing (58) the substrate (19) from the processing tool (10).

19 Claims, 2 Drawing Sheets

METHOD FOR CHEMICALLY-MECHANICALLY POLISHING A METAL LAYER

BACKGROUND OF THE INVENTION

This invention relates, in general, to chemical-mechanical polishing processes, and more particularly, to slurries for chemical-mechanical polishing processes.

Processes for manufacturing semiconductor devices often include a chemical-mechanical polishing (CMP) step to improve the planarity of a metal layer. The CMP step uses abrasive particles that are suspended in a colloidal slurry. Different additives or reagents can be combined with the slurry to improve the polishing rate and the selectivity of the slurry. As an example, various ionic salts, such as iron nitrate ($Fe(NO_3)_3$) or peroxide ($H_2O_2$), have been used as an oxidizer for metal CMP processes. Other reagents can also be combined with the slurry to improve the transport or Theological properties of the slurry, and still other reagents can be mixed into the slurry to inhibit the corrosion of the surface being polished.

However, with the addition of all the above-described reagents, the colloidal properties of the slurry are degraded. Furthermore, the degree of acidity or basicity (i.e., the pH value), the electrochemical properties, the Theological properties, and the colloidal properties of the slurry are very difficult to control independently. Consequently, the CMP process produces non-uniformly polished surfaces that have many defects.

Accordingly, a need exists for a slurry that provides an appropriate balance between the pH value, the colloidal properties, the electrochemical properties, and the rheological properties of the slurry while exhibiting adequate polishing selectivity between metal and dielectric surfaces, while having efficient transport properties during a CMP process, and while reducing the corrosion of metal surfaces during the CMP process.

DETAILED DESCRIPTION OF THE DRAWINGS

Figure 1:
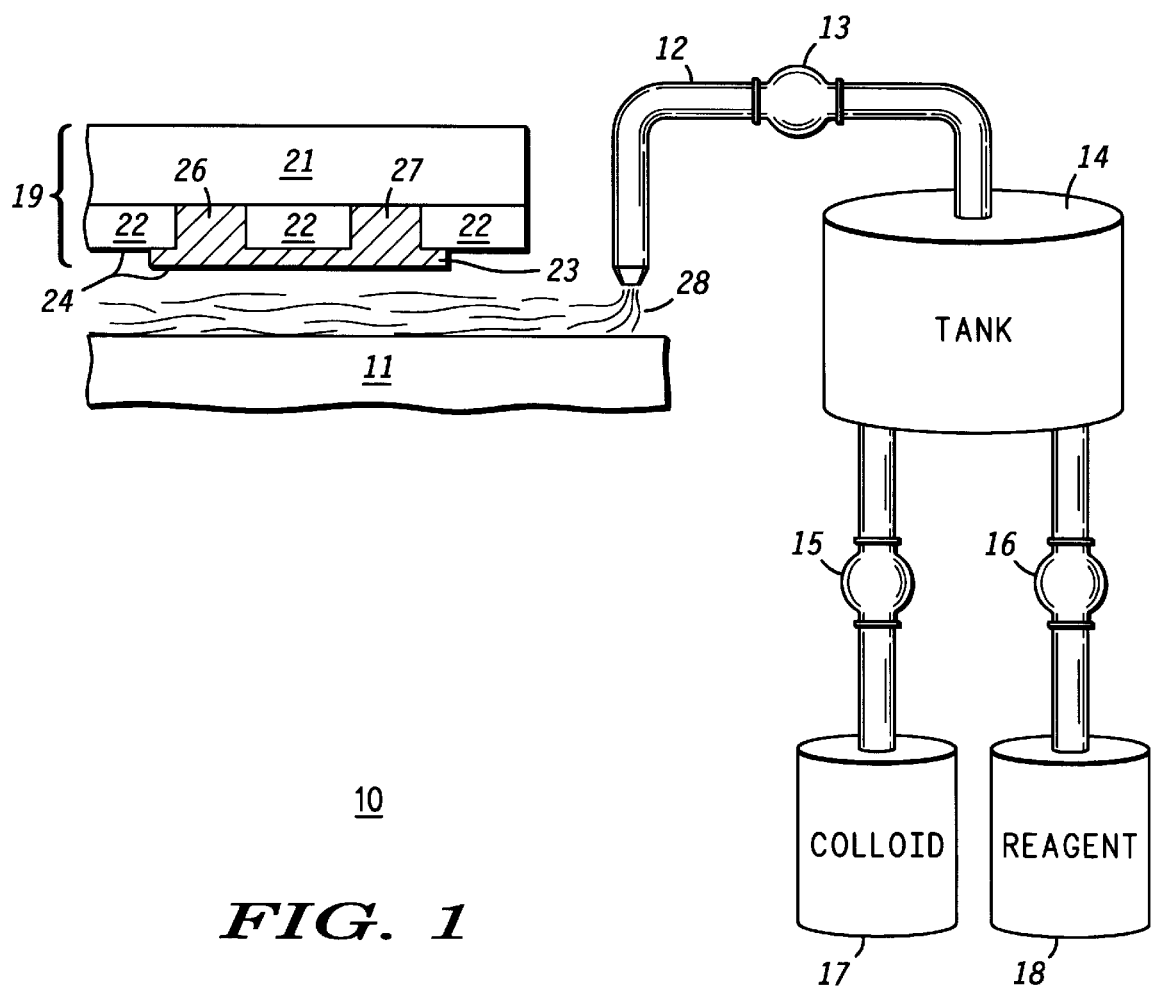
FIG. 1 illustrates a partial schematic view of a chemical-mechanical polishing tool in accordance with the present invention.

FIG. 1 illustrates a partial schematic view of a chemical-mechanical polishing (CMP) tool 10 that includes a dispensing tube 12 for dispensing a slurry 28 onto a polishing pad 11. A pump 13 extracts or pumps slurry 28 from a mixing or holding tank 14 into tube 12, and pumps 15 and 16 extract a colloid 17 and a reagent 18, respectively, into tank 14 to form slurry 28. In an alternative embodiment, tank 14 is not used in tool 10. Instead, an in-line mixer, as known in the art, is used in place of tank 14, and the use of pump 13 is optional.

Colloid 17 has a degree of acidity or basicity (i.e., a pH value or level) of approximately 1–12. Colloid 17 also includes abrasive particles typically comprises alumina or silica that are held in suspension within colloid 17. As an example, SC-112, which is a colloid containing silica particles, and WA335, which is a colloid containing alumina particles, are commercially available from Cabot Corporation of Tuscola, Ill. Reagent 18 is described in more detail hereinafter.

A substrate 19 is processed by tool 10. Substrate 19 can comprise a semiconductor layer 21 that supports an electrically insulative layer 22 and an electrically conductive layer 23, which can comprise a dielectric layer and a metal layer, respectively. As an example, layers 21 and 22 can comprise silicon and silicon oxide, respectively, and layer 23 can comprise aluminum, copper, tungsten, tantalum, tantalum nitride, titanium, or titanium nitride. Layer 22 has trenches or vias 26 and 27 in which a portion of layer 23 is located. A surface 24 of substrate 19 comprise a portion of layers 22 and 23.

Surface 24 is polished by slurry 28 and pad 11 in a conventional manner, wherein substrate 19, pad 11, or both are rotated as surface 24 is polished. Slurry 28 should have appropriate polishing selectivities for layers 22 and 23 in order for the CMP process to produce a substantially planar surface for substrate 19. Accordingly, the polishing rate for layer 23 should be significantly higher than the polishing rate for layer 22. Reagent 18 can provide the preferred polishing selectivities while substantially maintaining or balancing the colloidal, electrochemical, and rheological properties in slurry 28. Reagent 18 can also be used to inhibit the corrosion of electrically conductive layer 23 during the CMP process as described hereinafter. Suitable materials for reagent 18 are discussed hereinafter.

Reagent 18 can also be used to extend the lifetime of pad 11 and to improve the uniformity of the CMP process. Pad 11 typically has grooves, holes, or pores to improve the transport efficiency of slurry 28 across pad 11 because the same portion of slurry 28 should not remain between pad 11 and substrate 19 in order to ensure a uniform polishing of substrate 19. However, particles or by-products of the CMP process often clog the grooves, holes, or pores, which degrade the even distribution or transport of slurry 28 across pad 11, and thus, the quality of the CMP process is detrimentally affected. Reagent 18 can be used to passivate or protect the grooves, holes, or pores from becoming clogged while still permitting the grooves, holes, or pores to enhance the transport of slurry 28, as explained hereinafter. By preventing the grooves, holes, or pores from being clogged, reagent 18 extends the lifetime of pad 11 and also reduces the amount of maintenance required to condition or replace pad 11.

By using reagent 18 to accomplish all of the improvements described above, the colloidal properties of slurry 28 are not detrimentally degraded by the addition of too many additives. Consequently, the colloidal properties, the electrochemical properties, the selectivities, and the pH value of slurry 28 are more easily maintained and controlled. Clearly, the use of reagent 18 provides distinct advantages over the prior art.

Figure 2:
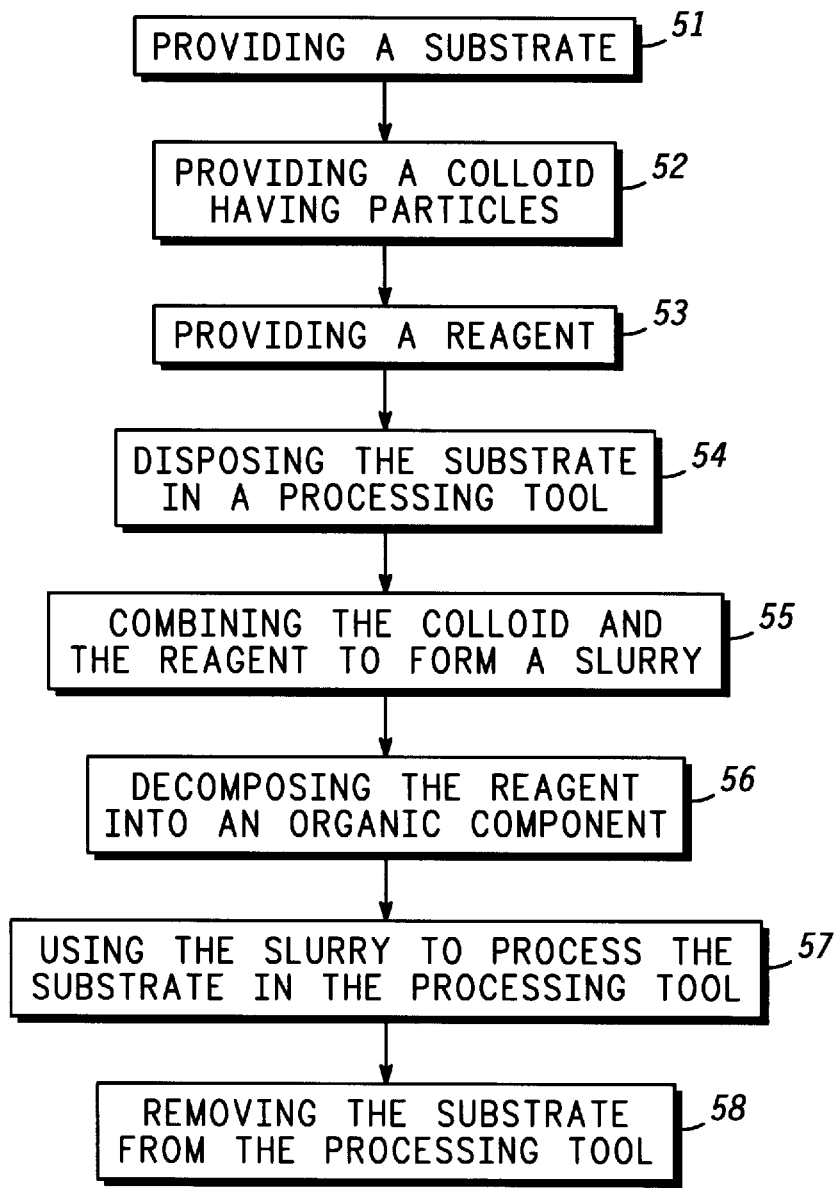
FIG. 2 outlines a method of chemically-mechanically polishing a substrate in accordance with the present invention.

FIG. 2 outlines a method 50 of chemically-mechanically polishing a substrate. Method 50 is described in relationship to fabricating a component or manufacturing a semiconductor device as previously described in FIG. 1. A substrate such as, for example, substrate 19 of FIG. 1 that has layers 22 and 23 is provided in a step 51 of method 50. A step 52 of method 50 provides a mixture having particles or a colloid such as, for example, colloid 17 of FIG. 1, and a step 53 of method 50 provides a reagent or an additive such as, for example, reagent 18 of FIG. 1.

Suitable reagents for step 53 include, but are not limited to, organic salts that are either chelated or non-chelated and that are either cationic or anionic. The examples presented hereinafter are provided to facilitate the understanding of the present invention and are not provided for the purpose of limiting the scope of the present invention. Examples of a non-chelated organic salt that is cationic include, but are not limited to, tetramethylammonium iodate ($(CH_3)_4NIO_3$), tetramethylammonium periodate ($(CH_3)_4NIO_4$), tetramethylammonium nitrate ($(CH_3)_4N^+NO_3^-$), tetraethylammonium nitrate ($(C_2H_5)_4N^+NO_3^-$), tetramethylammonium sulfate ($(C_3)_4N^+SO_4^-$) tetraethylammonium sulfate ($(C_2H_5)_4N^+SO_4^-$), and bistetramethylammonium persulfate ($(CH_3)_4N^+$ $_+S_2O_8^-$). An example of a non-chelated organic salt that is anionic includes, but is not limited to, ammonium methylsulfate ($NH_4^+CH_3SO_3^-$). Reagent 18 can alternatively comprise a non-chelated cationic or anionic organic salt that includes a transition metal such as, for example, tetramethylammonium iron sulfate ($N(CH_3)_4Fe(SO_4)_2$), tetramethylammonium cerium nitrate ($N(CH_3)_4Ce(NO_3)_6$), tetramethylammonium cerium sulfate ($N(CH_3)_4Ce(SO_4)_4$), tetramethylammonium aluminum sulfate ($N(CH_3)_4Al(SO_4)_4$), tetramethylammonium aluminum nitrate (($N(CH_3)_4Al(NO_3)_3$), ammonium iron methylsulfate ($NH_4FeCH_3SO_3^-$), and ammonium aluminum methylsulfate ($NH_4AlCH_3SO_3^-$). Furthermore, reagent 18 can comprise a chelating salt such as, for example, tetramethylammonium oxalate ($((CH_3)_4N)_2C_2O_4$).

A step 54 of method 50 disposes or positions substrate 19 in a processing tool such as, for example, CMP tool 10 of FIG. 1. Then, the mixture or colloid of step 52 is combined or mixed with the reagent or organic salt of step 53 during a step 55, which forms a slurry such as, for example, slurry 28 of FIG. 1. The slurry may comprise a weight ratio of approximately 10:1 to 100:1 between the colloid and the organic salt. Step 55 can be performed prior to or during a subsequent step 57 described hereinafter.

During a step 56, the reagent or organic salt is broken apart or separated apart into at least two reaction products or, more specifically, the reagent is decomposed into an oxidizer and a surfactant. As known in the art of CMP, it is common practice to refer to the oxidizer as an etchant, especially when the CMP process is applied to a layer comprising aluminum or copper. However, to facilitate the explanation of the present invention, the term "oxidizer" is used interchangeably with the term "etchant." The oxidizer and the surfactant can both be organic components, or the reaction products can comprise an organic component and an inorganic component.

As an example, if the organic salt comprises tetramethylammonium aluminum nitrate, then the organic salt can decompose into an organic component of tetramethylammonium hydroxide (TMAH) and an inorganic component of aluminum nitrate during step 56. The aluminum nitrate is an oxidizer that can improve the polishing rate of layer 23. The TMAH is a surfactant that passivates layer 22 of substrate 19 using a mechanism known in the art as steric hindrance or shielding to improve the selectivity of the slurry. Thus, the polishing rate of layer 23 is increased; the polishing rate of layer 22 is reduced; and the polishing selectivity of the slurry is improved. The TMAH also passivates polishing pad 11 and prevents the grooves, holes, or pores of pad 11 from being clogged by modifying interfacial forces between the slurry, pad 11, and substrate 19. Therefore, the lifetime of pad 11 is extended, and the transport efficiency of the slurry is not degraded. Consequently, process stability is improved, and the across-wafer and wafer-to-wafer non-uniformities are reduced. Furthermore, the TMAH is a corrosion inhibitor for electrically conductive layer 23 when layer 23 comprise aluminum.

The TMAH is not directly added to the colloid because the TMAH is basic and would significantly and detrimentally alter the pH level of the colloid and severely degrade the slurry transport, the rheological properties of the slurry, and many other aspects of the CMP process. However, the addition of tetramethylammonium aluminum nitrate does not detrimentally alter the stability of the colloid because tetramethylammonium aluminum nitrate is in a salt form that includes compensated counter ions. The changes in the pH level associated with the addition of the tetramethylammonium aluminum nitrate still provide a stable colloidal suspension.

TMAH and aluminum nitrate are not individually added or combined with the colloid because of difficulties in obtaining a balanced pH level while mixing the TMAH and the aluminum nitrate with the colloid. However, the difficulties associated with maintaining a balanced pH level are alleviated when a salt, which has compensated counter ions, is mixed with the colloid. Therefore, a single reagent of tetramethylammonium aluminum nitrate is added to the colloid to provide the advantages discussed above without detrimentally affecting the colloidal, electrochemical, or Theological properties of the slurry. For similar reasons, the slurry of step 55 preferably consists essentially of the colloid and the organic salt and preferably does not contain other additives. Thus, the decomposition of the organic salt improves many aspects of the polishing performance of the slurry without degrading other aspects of the CMP process.

The slurry of step 55 is used to process substrate 19 in the CMP tool by applying the colloid and the reagent or organic salt to substrate 19 to chemically and mechanically polish substrate 19 during a step 57. After the CMP process of step 57, substrate 19 is removed from the CMP tool during a step 58. The physical or chemical reaction of the organic salt with a metal serves as a catalyst for the decomposition of the organic salt in step 56. The metal could include an exposed metal within the electrically conductive layer 23 of substrate 19, or polishing product on the polishing pad 11 (FIG. 1). Additional heat can be supplied during step 57 to further promote the decomposition of the organic salt. Additional heat or increased down force pressure during step 57 can be provided during polishing. Therefore, steps 55 and 56 can occur during step 57 by using point-of-use mixing. The organic salt preferably does not decompose during steps 52, 53, or 55 so that the colloidal properties and the pH value of the slurry are not degraded prior to using the slurry in step 57.

As an example, the electrically conductive layer 23 is a copper layer, and the electrically insulative layer is an oxide layer. The substrate 19 including the copper and oxide layers is polished using a slurry formulation that includes a non-chelated organic salt that forms tetramethylammonium sulfate cations. The copper polishing rate is in a range of approximately 4000–6000 angstroms per minute, and the selectivity is in a range of approximately 100:1 to 200:1 (angstroms of copper polished for each angstrom of oxide polished.)

Therefore, it is apparent there has been provided an improved slurry for chemically-mechanically polishing a metal layer that overcomes the disadvantages of the prior art. The use of fewer reagents in the slurry can simultaneously provide all of the previously described improvements over conventional slurries wherein the improvements include, but are not limited to, improving polishing selectivity, preventing metal corrosion during polishing, improving slurry transport efficiency, and extending the lifetime of a polishing pad. The use of fewer reagents instead of a large plurality of reagents reduces the cost of the CMP process, stabilizes the colloid, and simplifies the CMP process. Furthermore, the colloidal, electrochemical, and rheological properties of the slurry are not significantly distorted because fewer reagents are added compared to the prior art.

While the invention has been particularly shown and described with reference to preferred embodiments, it will be understood by those skilled in the art that changes in form and detail may be made without departing from the spirit and scope of the invention. For instance, the numerous details set forth herein, such as, for example, the specific chemical compositions of the organic salts, are provided to facilitate the understanding of the present invention and are not provided to limit the scope of the invention. Furthermore, although reagent 18 is depicted in FIG. 1 as being added to colloid 17 during a semiconductor device manufacturing process, it is understood that reagent 18 may be added to colloid 17 by a vendor and then shipped to a semiconductor device manufacturer for use in a semiconductor device manufacturing process. Accordingly, the disclosure of the present invention is not intended to be limiting. Instead, the disclosure of the present invention is intended to be illustrative of the scope of the invention, which is set forth in the following claims.

We claim:

1. A method of manufacturing a semiconductor device comprising:

providing a substrate that includes an exposed metal layer;

providing a mixture having particles and an organic salt; and applying the mixture to the substrate, wherein the organic salt decomposes into an oxidizer and surfactant after contacting the exposed metal layer.

2. The method of claim 1, wherein the step of applying the mixture is performed such that the exposed metal layer includes a material selected from a group consisting of aluminum, copper, and tungsten.

3. The method of claim 1, wherein the step of providing the mixture includes providing a non-chelated organic salt for the organic salt.

4. The method of claim 1, wherein the step of applying the mixture is performed to provide an inorganic component for the oxidizer.

5. The method of claim 1, wherein the step of applying the mixture is performed to provide an organic component for the oxidizer.

6. The method of claim 1, wherein:

the oxidizer includes an anion selected from a group consisting of a periodate, a nitrate, a sulfate, and an oxalate; and the surfactant includes an organic surfactant.

7. The method of claim 1, wherein the step of providing the mixture includes providing a slurry and wherein the step of applying the mixture includes using the slurry to polish the substrate.

8. The method of claim 1, wherein:

the particles are part of a colloid; and the mixture has a weight ratio of the colloid to the organic salt, wherein the weight ratio is in a range of approximately 10:1 to 100:1.

9. The method of claim 1, wherein:

the substrate further includes an insulative layer; and the step of polishing has a metal layer to insulative layer polishing selectivity that is in a range of approximately 100:1 to 200:1.

10. The method of claim 1, wherein:

the oxidizer includes a metal-containing inorganic oxidizer; and the surfactant includes an organic surfactant.

11. The method of claim 10, wherein the metal-containing inorganic oxidizer includes a metal selected from a group consisting of iron, cerium, and aluminum.

12. A method of manufacturing a semiconductor device comprising:

disposing a substrate having an exposed metal layer in a processing tool;

combining a colloid and an organic salt to form a slurry;

polishing the substrate with the slurry in the processing tool, wherein:

the organic salt decomposes into a surfactant and an oxidizer; and the oxidizer includes an anion selected from a group consisting of a periodate, a nitrate, a sulfate, and an oxalate; and removing the substrate from the processing tool.

13. The method of claim 12, wherein the step of polishing the substrate decomposes the organic salt into a plurality of organic components.

14. The method of claim 12, wherein the step of combining the organic salt includes providing a transition metal in the organic salt.

15. The method of claim 12, wherein the steps of combining the colloid and the organic salt and polishing occur simultaneously.

16. The method of claim 12, wherein the organic salt decomposes after contacting the exposed metal layer.

17. The method of claim 12, wherein the organic salt includes a metal selected from the group consisting of iron, cerium, and aluminum.

18. The method of claim 12, wherein the slurry has a weight ratio of the colloid to the organic salt, wherein the weight ratio is in a range of approximately 10:1 to 100:1.

19. The method of claim 12, wherein:

the substrate further includes an insulative layer; and the step of polishing has a metal layer to insulative layer polishing selectivity that is in a range of approximately 100:1 to 200:1.

* * * * *